US010254362B2

(12) United States Patent
Mathieu et al.

(10) Patent No.: US 10,254,362 B2
(45) Date of Patent: Apr. 9, 2019

(54) MAGNETIC RESONANCE IMAGING MATRIX SHIM COIL SYSTEM AND METHOD

(71) Applicant: General Electric Company, Schenectady, NY (US)

(72) Inventors: Jean-Baptiste Mathieu, Florence, SC (US); Derek Allan Seeber, Florence, SC (US); Seung-Kyun Lee, Cohoes, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 650 days.

(21) Appl. No.: 14/927,823

(22) Filed: Oct. 30, 2015

(65) Prior Publication Data

US 2017/0123026 A1 May 4, 2017

(51) Int. Cl.
*G01V 3/00* (2006.01)
*G01R 33/3875* (2006.01)
*G01R 33/565* (2006.01)

(52) U.S. Cl.
CPC ... *G01R 33/3875* (2013.01); *G01R 33/56518* (2013.01); *G01R 33/56563* (2013.01)

(58) Field of Classification Search
CPC .................................. G01R 33/3875
USPC .................................. 324/322, 318
See application file for complete search history.

(56) References Cited

U.S. PATENT DOCUMENTS

| 4,698,591 A | 10/1987 | Glover et al. |
| 4,950,994 A * | 8/1990 | Glover ................. G01R 33/385 324/318 |
| 5,742,164 A | 4/1998 | Roemer et al. |
| 6,025,715 A | 2/2000 | King et al. |
| 6,335,620 B1 | 1/2002 | Weissenberger |
| 6,342,787 B1 | 1/2002 | Petropoulos et al. |
| 6,850,066 B2 | 2/2005 | Havens et al. |
| 8,536,870 B2 | 9/2013 | Punchard et al. |
| 9,638,776 B2 | 5/2017 | Parizh et al. |
| 2013/0157865 A1 | 6/2013 | Shen et al. |
| 2014/0184222 A1 | 7/2014 | Seeber et al. |
| 2014/0184226 A1 | 7/2014 | Seeber |
| 2014/0232393 A1 | 8/2014 | Wheaton et al. |

OTHER PUBLICATIONS

Combined Search and Examination Report issued in connection with corresponding GB Application No. 1618017.6 dated Feb. 14, 2017.
Karl Edler and David Hoult; "Spherical Harmonic Inductive Detection Coils for Dynamic Pre-Emphasis"; Magnetic Resonance in Medicine, 2008, vol. 60, pp. 277-287; Institute for Biodiagnostics, National Research Council Canada.

(Continued)

*Primary Examiner* — Louis Arana
(74) *Attorney, Agent, or Firm* — Grogan, Tuccillo & Vanderleeden, LLP (57) ABSTRACT

A method for improving image quality in a magnetic resonance imaging system, the method includes rapidly modulating an electrical current in a matrix shim coil of the magnetic resonance imaging system to compensate high order eddy currents in the system.

18 Claims, 6 Drawing Sheets

(56) References Cited

OTHER PUBLICATIONS

CH. Boesch, R. Gruetter, E. Martin; "Temporal and Spatial Analysis of Fields Generated by Eddy Currents in Superconducting Magnets: Optimization of Corrections and Quantitative Characterization of Magnet/Gradient Systems"; Magnetic Resonance in Medicine, 1991, vol. 20, pp. 268-284; University Children's Hospital, Zurich, Switzerland.

Saikat Sengupta, Malcolm J. Avison, John C. Gore, E. Brian Welch; "Software Compensation of Eddy Current Fields in Multislice High Order Dynamic Shimming"; Journal of Magnetic Resonance, 2011, vol. 210, pp. 218-227; USA.

\* cited by examiner

MAGNETIC RESONANCE IMAGING MATRIX SHIM COIL SYSTEM AND METHOD

BACKGROUND

Technical Field

Embodiments of the invention relate generally to magnetic resonance imaging (MRI) and, more specifically, to a system and method for using matrix shim coils to generate magnetic fields with low to high order spatial harmonics.

Discussion of Art

MRI is a widely accepted and commercially available technique for obtaining digitized visual images representing the internal structure of objects having substantial populations of atomic nuclei that are susceptible to nuclear magnetic resonance (NMR). In MRI, imposing a strong main magnetic field ($B_0$) on the nuclei polarizes nuclei in the object to be imaged. The nuclei are excited by a radio frequency (RF) signal at characteristics NMR (Larmor) frequencies. By spatially disturbing localized magnetic fields surrounding the object and analyzing the resulting RF responses from the nuclei as the excited protons relax back to their lower energy normal state, a map or image of these nuclei responses as a function of their spatial location is generated and displayed. An image of the nuclei responses provides a non-invasive view of an object's internal structure. Additionally, Many MRI systems use electromagnetic gradient coils to produce small amplitude, spatially varying magnetic fields. Typically, the magnetic component produced by gradient coils is aligned along the z-axis of the MRI system and varies linearly in amplitude with position along one of the x, y or z axes of the MRI system. Accordingly, many MRI systems use gradient coil to create a small ramp on the magnetic field strength, and concomitantly on the resonant frequency of the nuclear spins, along a single axis.

In a typical MRI system, the more uniform the $B_0$ field, the better the quality of images produced. Inhomogeneities may be introduced into the $B_0$ field ($B_0$ field inhomogeneities) by various factors, however, such as manufacturing tolerances, installation errors, environmental effects, design restrictions, imperfections in one or more magnet(s), ferromagnetic material near the installation site, and/or other sources of electromagnetic noise/interference. For example, time varying magnetic fields can produce $B_0$ field inhomogeneities by generating currents, known as eddy currents, within the MRI machinery and/or the subject being imaged. In turn, the generated eddy currents may produce additional magnetic fields, known as eddy current fields and/or reflective fields, which can distort the $B_0$ field and degrade image quality.

In order to compensate for image degradation caused by eddy currents, and/or other sources of $B_0$ field inhomogeneities, many MRI systems implement a technique known as "pre-emphasis" to reduce the effect of $B_0$ field inhomogeneities. Traditional MRI systems achieve pre-emphasis by modulating the current in the gradient coils in an attempt to mitigate the distortion of the $B_0$ field due to $B_0$ field inhomogeneities. The geometric shapes which gradient coils can modulate is limited, which in turn limits the spatial harmonics order of $B_0$ field inhomogeneities that can be compensated for.

What is needed, therefore, is a system and method that improves overall imaging performance and, in particular, provides for the mitigation of high order spatial harmonic $B_0$ field inhomogeneities.

BRIEF DESCRIPTION

In an embodiment, a method for improving image quality in a magnetic resonance imaging system is provided. The method includes rapidly modulating an electrical current in a matrix shim coil of the magnetic resonance imaging system to compensate high order eddy currents in the system.

In another embodiment, a method for compensating gradient coil alignment in a magnetic resonance imaging system is provided. The method includes rapidly modulating an electrical current in a matrix shim coil of the magnetic resonance imaging system to mitigate one or more $B_0$ field orientation deviations resulting from the alignment of one or more gradient coils.

In yet another embodiment, a matrix shim coil apparatus for compensating high order eddy currents in a magnetic resonance imaging system is provided. The matrix shim coil apparatus includes a matrix shim coil configured to compensates $B_0$ field inhomogeneities having high spatial harmonic orders. An electrical current in a first shim coil of the matrix shim coil is rapidly modulated independently from the electrical current in a second shim coil of the matrix shim coil.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled, "electrically connected" and "electrical communication" means that the referenced elements are directly or indirectly connected such that an electrical current may flow from one to the other. The connection may include a direct conductive connection (i.e., without an intervening capacitive, inductive or active element), an inductive connection, a capacitive connection, and/or any other suitable electrical connection. Intervening components may be present. As will be appreciated, embodiments of the present invention may be used to analyze animal tissue generally and are not limited to human tissue.

Figure 1:
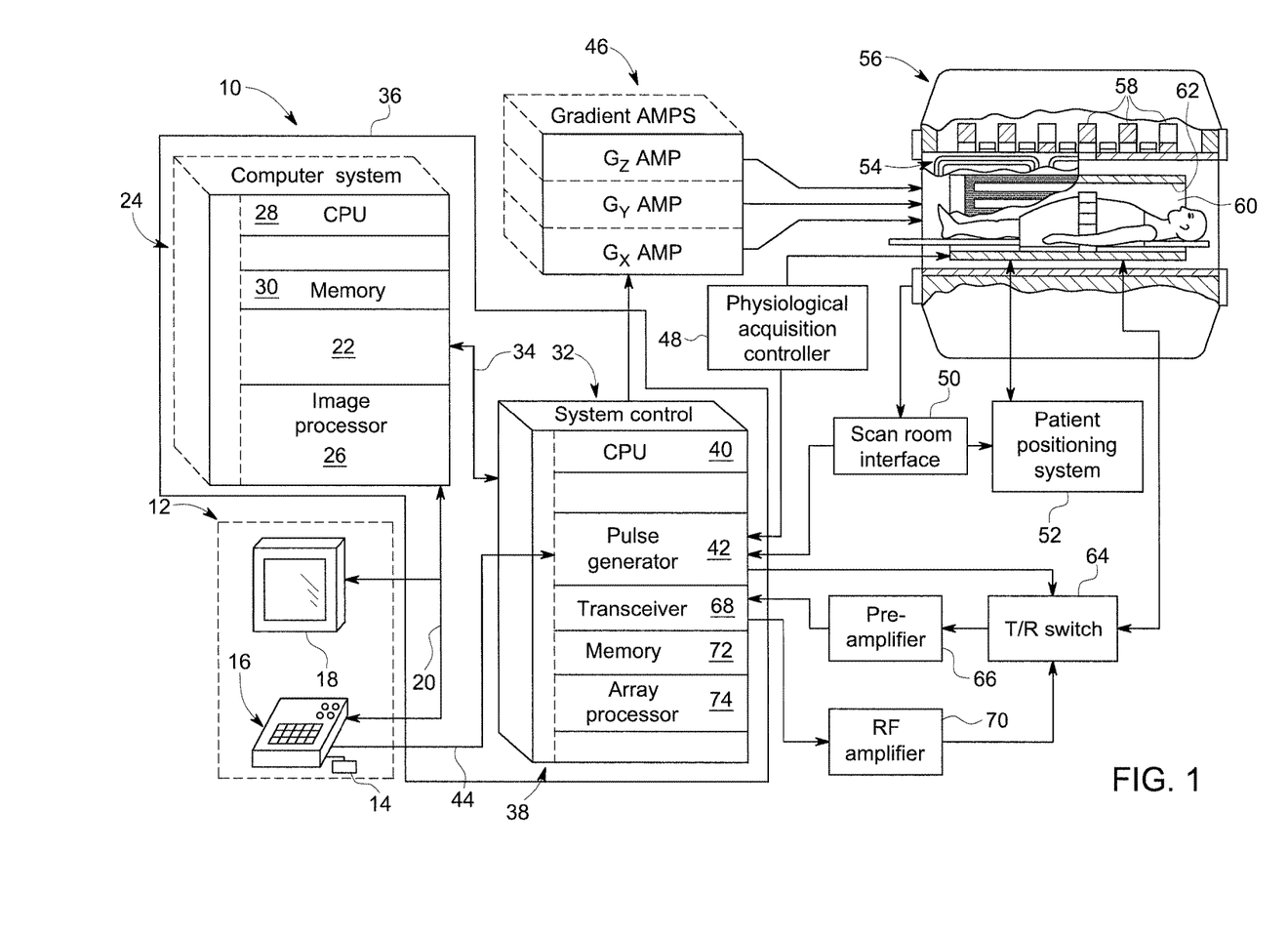
FIG. 1 is a block diagram of an exemplary magnetic resonance imaging (MRI) system that incorporates embodiments of the invention.

Referring to FIG. 1, the major components of a magnetic resonance imaging (MRI) system 10 incorporating an embodiment of the invention are shown. Operation of the system is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50 which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either the transmit or receive mode.

The MR signals picked up by the RF coil 62 are digitized by the transceiver module 68 and transferred to a memory module 72 in the system control 32. A scan is complete when an array of raw k-space data has been acquired in the memory module 72. This raw k-space data is rearranged into separate k-space data arrays for each image to be reconstructed, and each of these is input to an array processor 74 which operates to Fourier transform the data into an array of image data. This image data is conveyed through the serial link 34 to the computer system 22 where it is stored in memory 30. In response to commands received from the operator console 12, this image data may be archived in long term storage or it may be further processed by the image processor 26 and conveyed to the operator console 12 and presented on the display 18.

Figure 2:
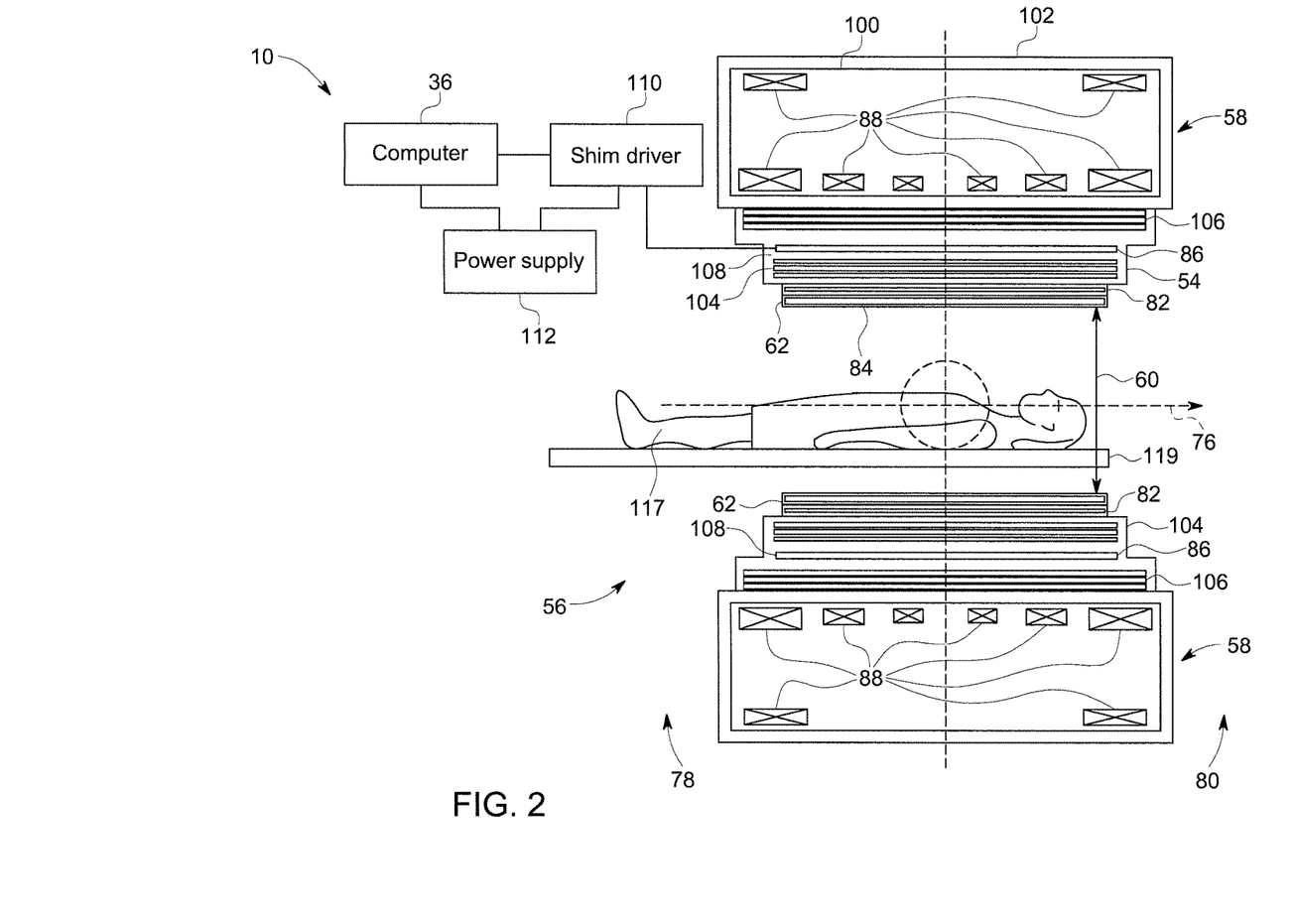
FIG. 2 is a schematic side elevation view of the MRI system of FIG. 1.

Referring to FIG. 2, a schematic side elevation view of the MRI system 10 of FIG. 1 is shown. The magnet assembly 56 is cylindrical in shape having a center axis 76, a "patient end" 78 and a "service end" 80 opposite of the patient end 78. The magnet assembly 56 includes the superconducting/polarizing magnet 58, the gradient coil assembly 54, a RF shield 82, the RF coil 62, a patient bore tube 84 and a matrix shim coil 86. The magnetic assembly 56 may further include various other elements such as covers, supports, suspension members, end caps, brackets, etc. which have been omitted from FIG. 2 for clarity. While the embodiment of the magnetic assembly 56 shown in FIGS. 1 and 2 utilize a cylindrical magnet and gradient topology, it should be understood that magnet and gradient topologies other than cylindrical assemblies may be used. For example, a flat gradient geometry in a split-open MRI system may also utilize embodiments of the invention described below.

The polarizing magnetic 58 may include several radially aligned longitudinally spaced apart superconductive coils 88, wherein each coil is capable of carrying a large current. The superconductive coils 88 are designed to create the $B_0$ field within the patient/target volume 60. The superconductive coils 88 are enclosed in a cryogen environment within a cryogenic envelope 100. The cryogenic environment is designed to maintain the temperature of the superconducting coils 88 below the appropriate critical temperature so that the superconducting coils 88 are in a superconducting state with zero resistance. The cryogenic envelope 100 may include a helium vessel (not shown) and thermal or cold shields (not shown) for containing and cooling magnet windings in a known manner. The polarizing magnet 58 is enclosed by a magnet vessel 102, e.g., a cryostat vessel. The magnet vessel 102 is configured to maintain a vacuum and to prevent heat from being transferred to the cryogenic envelop 100.

The gradient coil assembly 54 is disposed within the inner circumference of the polarizing magnetic 58 and around the RF shield 82 and the RF coil 62 in a spaced-apart coaxial relationship. The gradient coil assembly 54 may be mounted to the polarizing magnet 58 such that the gradient coil assembly 54 is circumferentially surrounded by the polarizing magnet 58. The gradient coil assembly 54 may also circumferentially surround the RF shield 82 and the RF coil 62. In embodiments, the gradient coil assembly 54 may be a self-shielded gradient coil assembly. For example, the gradient coil assembly 54 may comprise a cylindrical inner gradient coil assembly or winding 104 and a cylindrical outer gradient coil assembly or winding 106 both disposed in a concentric arrangement with respect to the center axis 76. The inner gradient coil assembly 104 includes inner (or main) X-, Y- and Z-gradient coils and the outer gradient coil assembly 106 includes the respective outer (or shielding) X-, Y-, and Z-gradient coils. The coils of the inner gradient coil assembly 104 may be activated by passing an electric current through the coils to generate a gradient field in the patient volume 60 as required in MR imaging. A volume 108 or space between inner gradient coil assembly 104 and the outer gradient coil assembly 106 may be filled with a bonding material, e.g., epoxy resin, visco-elastic resin, polyurethane, etc. Alternatively, an epoxy resin with filler material such as glass beads, silica and alumina may be used as the bonding material. Additionally, the matrix shim coil 86 may be disposed in the volume 108 between the inner gradient coil assembly 104 and the outer gradient coil assembly 106.

The RF shield 82 is cylindrical in shape and is disposed around the RF coil 62. The RF shield 82 is used to shield the RF coil 62 from external sources of RF radiation and may be fabricated from any suitable conducting material, for example, sheet copper, circuit boards with conducting copper traces, copper mesh, stainless steel mesh, other conducing mesh, etc.

The RF coil 62 is cylindrical and is disposed around an outer surface of the patient bore tube 84 and mounted inside the cylindrical gradient coil assembly 54. The patient bore tube 84 surrounds the cylindrical patient/target volume or bore 60. The patient bore tube 84 can be configured as a standard bore size (~60 cm) or as a wide bore size (~70 cm or greater).

The matrix shim coil 86 is disposed at a first radius inside the magnet assembly 58 and provides compensation of $B_0$ field inhomogeneties, e.g., patient induced harmonics through shimming. Shimming, as defined herein, is the compensation of inhomogeneties in a magnetic field by modulating the electrical current in an electromagnet. Specifically, electrical current is conducted through the matrix shim coil 86 in order to generate one or more magnetic fields that counteract/compensate the disturbances in the $B_0$ field caused by the $B_0$ field inhomogeneties. As such, while FIG. 2 depicts the matrix shim coil 86 located inside the gradient coil assembly 54, it is to be understood that the matrix shim coil 86 may be disposed at any location at which the magnetic field(s) produced by the matrix shim coil 86 can provide effective compensation of $B_0$ field inhomogeneities. However, placing the matrix shim coil 86 behind the RF shield 82 limits interactions between the matrix shim coil 86 and the RF coil 62.

As further shown in FIG. 2, the matrix shim coil 86 may be driven by a shim driver 110. The shim driver 110 and the matrix shim coil 86 may be powered by a power supply 112. The power supply 112 and shim driver 110 may be operated by a computer system (e.g., MRI controller 36 as shown in FIG. 1). The computer 36 and the shim driver 110 are configured to control the current supplied to matrix shim coil 86 to provide global shimming over a desired volume of interest (e.g., the patient/target volume 60). The computer 36 and the shim driver 110 may also be configured to control the current supplied to matrix shim coil 86 to provide global dynamic shimming over a desired volume of interest.

The shim driver 110 produces data called shim waveforms that control the timing and shape of the magnetic field(s) produced by the matrix shim coil 86. The shim waveforms may control the timing and shape of the produced magnetic field(s) by modulating the electrical current flowing through the matrix shim coil 86. Shim waveforms may modulate the electrical current flowing to individual shim coils (shown as 114 in FIG. 3) within the matrix shim coil 86 or to groups of shim coils (shown as 116 in FIG. 3). The shim waveforms may be configured to rapidly modulate electrical current flowing through the matrix shim coil 86. The shim driver 110 may modify the waveforms during a MRI scan to produce real-time, or near real time, dynamic shimming. For example, each slice of a MRI sequence may have a unique set of currents to each shim coil 114, or group of shim coils 116, within the matrix shim coil 86. In embodiments, the electrical current may be rapidly modulated as fast as the hardware limit of gradient field update allows for. In certain embodiments, the speed of rapid modulation may be approximately 4 microseconds from one value to another. In embodiments, slower modulation speeds may be used depending on the application, the capabilities of the shim driver 110, and the inductance of the matrix shim coil 86. For example, in embodiments, the matrix shim coil 86 modulation time for slice-dependent shimming may be based at least in part on the repetition time of an imaging sequence (e.g.; in the range of 5 msec to 5000 msec).

Figure 3:
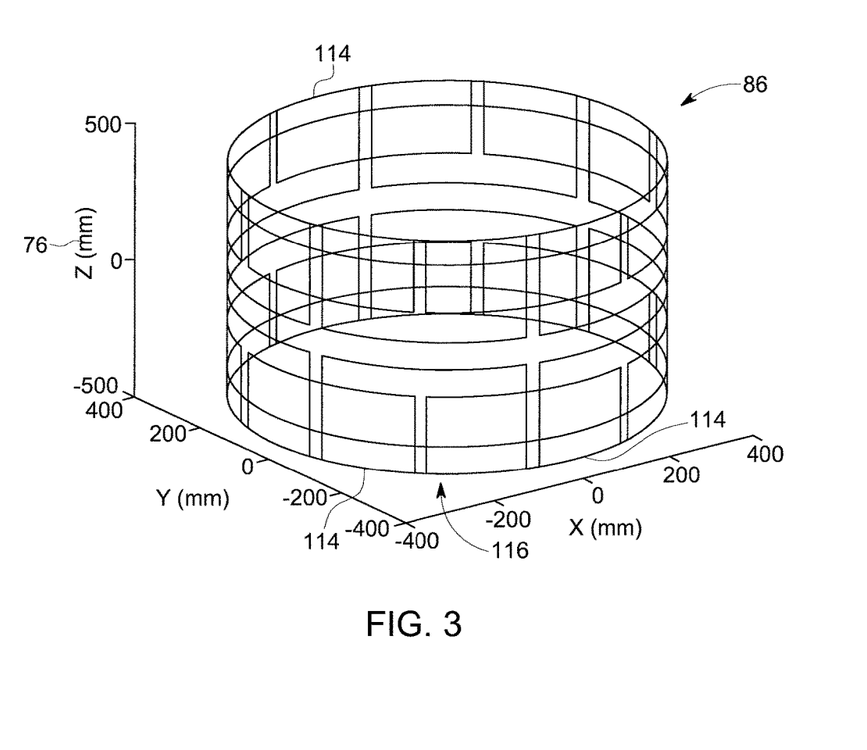
FIG. 3 is a diagram of an exemplary matrix shim coil of the MRI system of FIG. 1.

Referring to FIG. 3 a diagram of an exemplary matrix shim coil 86 in accordance with an embodiment is shown. The matrix shim coil 86 includes a plurality of individual shim coils 114 disposed on a cylindrical surface around an inner gradient coil assembly (shown as 54 in FIG. 2). In embodiments, the matrix shim coil 86 may also include second order or higher unshielded resistive shim coils (not shown). The shim coils 114 may be etched on a circuit board or the shim coils 114 may be fabricated from a continuous length on insulated copper wire wound in the desired pattern. In an embodiment, a circuit board may contain an FR4 backing and etched copper. In another embodiment, a circuit board may be a multi-layer Kapton circuit board with interleaving layers of etched copper and Kapton insulation.

The matrix shim coil 86 includes n rows of coils along the z direction (which corresponds to the center axis 76) and m coils around the circumference of the cylindrical structure to form an n×m array of shim coils 114. The higher the number of individual shim coils 114 in a matrix shim coil 86 the high the order of spatial harmonics of the $B_0$ field inhomogeneities the matrix shim coil 86 can compensate for. For example, the exemplary matrix shim coil 86 shown in FIG. 3 includes twenty-four (24) shim coils 114 arranged in 4 rows along the z-direction 76 and has six (6) shim coils 114 in each row along the circumference of the cylindrical structure. As such, the exemplary matrix shim coil 86 shown in FIG. 3 can compensate $B_0$ field inhomogeneities having a spatial harmonic order of approximately up to $Y_{LM}=Y_{43}$.

In other embodiments, the matrix shim coil 86 may have a 6×4 matrix array. In yet other embodiments, the matrix shim coil 86 may include an n×n array of shim coils 114. Additionally, the shim coils 114 may be arranged in the matrix shim coil 86 in overlapping pairs or groups 116.

The shim coils 114 may be of different shapes, for example, the shim coils 114 may be p-sided polygons and/or circular. Polygon and circular shaped shim coils 114 may couple to the gradient coils 104 and 106, however, which may induce large voltages in the matrix shim coil 86 during pulsing. Such coupling in turn may require large voltages in the shim driver 110 to achieve effective shimming. Any coupling between the matrix shim coil 86 and the gradient coils 104 and 106, however, may be reduced and/or eliminated by twisting the individual shim coils 114 into a figure eight or hourglass shape. In particular, a figure eight shape minimizes the net radial flux of the gradient coils 104 and 106, which reduces feedback voltage to the shim driver 110. Other designs for shim coils 114 and matrix shim coils 86 are disclosed in U.S. Pat. App. No.: 2014/0,184,222, which is hereby incorporated by reference in its entirety.

Figure 4:
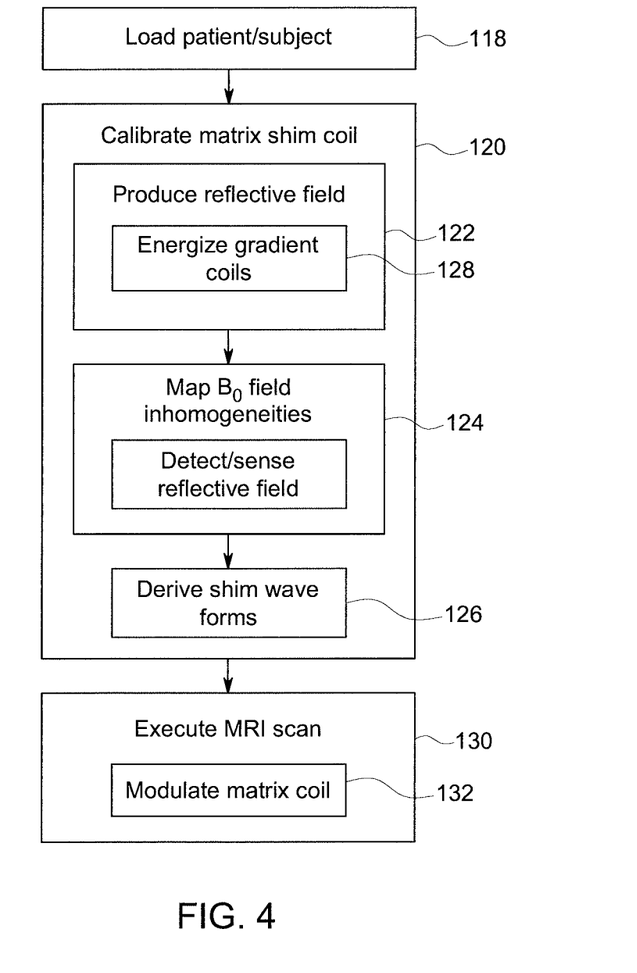
FIG. 4 is a flowchart showing a method of improving image quality by compensating for high order eddy currents according to an embodiment of the invention.

Referring now to FIG. 4, a flowchart showing a method for compensating for high order eddy currents, according to an embodiment of the invention, is shown. At block 118, a patient or imaging subject (shown as 117 in FIG. 2) is inserted into the magnetic assembly 56 along the center axis 76 (e.g., a Z-axis) on a patient table or cradle (shown as 119 in FIG. 2). The patient table or cradle 119 is then inserted into the magnetic assembly 56 at the patient end 78.

At block 120, the matrix shim coil 86 is calibrated. As shown by blocks 122, 124 and 126, calibrating the matrix shim coil 86 may include producing a reflective field, mapping the reflective field to create a $B_0$ field inhomogeneities map, and deriving shim waveforms from the $B_0$ field inhomogeneities map, wherein the shim waveforms are designed to reduce and/or eliminate the $B_0$ field inhomogeneities produced by the reflective field. In embodiments, deriving the shim waveforms 126 may be a process apart from calibrating 120 the matrix shim coil 86.

As shown at block 122, producing the reflective field may include energizing, at block 128, one or more gradient coils 104. The gradient coils 104 may be energized simultaneously, individually, or in groups. For example, in some embodiments, the x, y and z gradient coils 104 may be simultaneously energized with the produced reflective field being mapped at block 124. In other embodiments, the x gradient coil may be energized at block 128 with the produced reflective field mapped at block 124, followed by the y gradient coil being energized at block 128 with the produced reflective field being mapped at block 124, followed by the z gradient coil being energized at block 128 with the corresponding reflective field being mapped at block 124. In yet still other embodiments, the x and y, y and z, or z and x gradient coils may be energized at block 128 and the resulting reflective field mapped at block 124, followed by the z, x, or y gradient coil being energized at block 128 with the corresponding reflective field being mapped at block 124, respectively.

Mapping of the reflective field at block 124 may include using one or more sensors to detect the reflective field. In certain embodiments, separate mappings may be combined to create the $B_0$ field inhomogeneities map. For example, if the x, y and z gradient coils were separately energized and mapped, the corresponding $B_0$ field inhomogeneities maps may be combined to create a single $B_0$ field inhomogeneities map. Shim waveforms are then derived from the $B_0$ field inhomogeneities map at step 126. The derived shim waveforms may be stored in a memory component such as memory 30 or 72.

At block 130, a MRI scan is executed during which $B_0$ field inhomogeneities are reduced and/or eliminated by modulating the matrix shim coil 86 in accordance with the derived shim waveforms as shown by block 132. In embodiments, the shim waveforms may be retrieved from the memory components such as memory 30 and 72 and loaded into the shim driver 110, or other processor that may control the shim driver 110, such as CPU 28 or 40. The shim driver 110 then modulates the matrix shim coil 86 in accordance with the derived shim wave forms, thereby mitigating and/or decreasing the effect of the $B_0$ field inhomogeneities.

Embodiments of the present invention may also be used to compensate for $B_0$ field deviations. $B_0$ field deviations are deviations in the orientation/alignment of the $B_0$ field with respect to the central axis 76 (or another axis such as the x or y axes) which result from the alignment of one or more gradient coils 104. $B_0$ field deviations may be the result of gradient coil installation errors or the result of an intended $B_0$ field offset.

Figure 5:
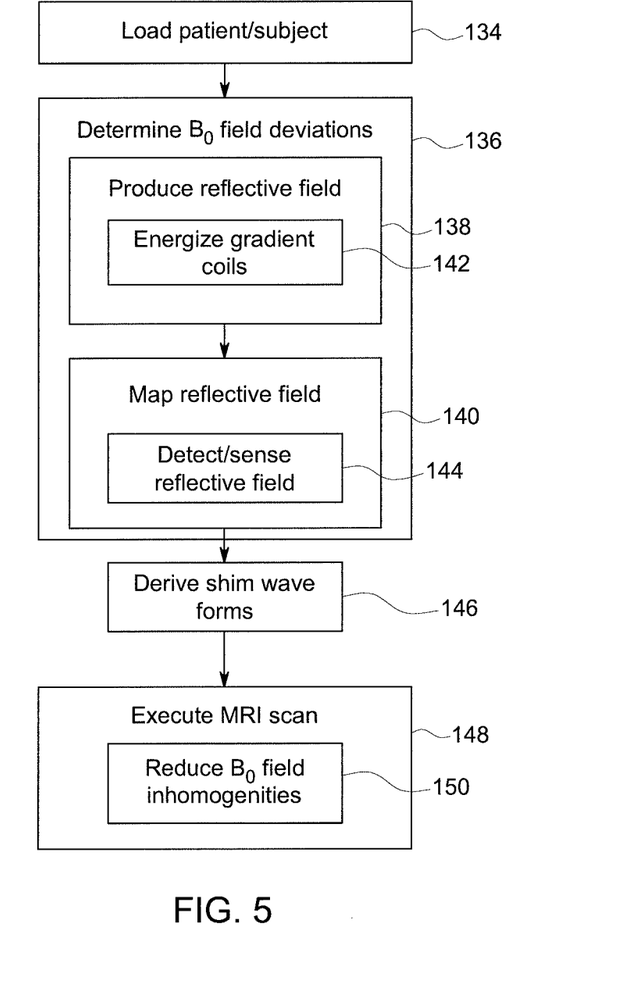
FIG. 5 is a flowchart showing a method of improving image quality by compensating for gradient coil installation errors according to another embodiment of the invention.

Referring to FIG. 5, a flowchart depicting a method to compensate for gradient coil installation errors is shown. At block 134, a patient or imaging subject (shown as 117 in FIG. 2) is inserted into the magnetic assembly 56 along the center axis 76 (e.g., a Z-axis) on a patient table or cradle (shown as 119 in FIG. 2). The patient table or cradle 119 is then inserted into the magnetic assembly 56 at the patient end 78.

At block 136, $B_0$ field deviations resulting from gradient coil installation errors are determined. As shown by blocks 138 and 140, determining the $B_0$ field deviations may include producing a reflective field and mapping the reflective field. As shown by block 142, producing the reflective field may include energizing one or gradient coils 104. The gradient coils 104 may be energized in the same manner described above in regards to block 128. In embodiments, mapping the reflective field at block 140 may include mapping $B_0$ field inhomogenities within the reflective field in a manner similar to the process described herein with regard to block 124. For example, mapping 140 the reflective field may include detecting and/or sensing the reflective field at block 144.

At block 146, the determined $B_0$ field deviations are used to derive shim waveforms, which are designed to reduce and/or eliminate the $B_0$ field deviations resulting from gradient coil installation errors. The derived shim waveforms are configured/designed such that the total $B_0$ field deviation (e.g., the sum of the $B_0$ deviations resulting from gradient coil installation errors) is reduced or eliminated in the presence of shim fields generated by the matrix shim coil 86. The derived shim waveforms may be stored in a memory component such as memory 30 or 72. In embodiments, deriving 146 shim waveforms may be included in determining the $B_0$ field deviations at block 136.

At block 148, a MRI scan is executed during which $B_0$ field inhomogeneities resulting from gradient coil installation errors are reduced and/or eliminated by modulating the matrix shim coil 86 in accordance with the derived shim waveforms as shown at block 150. In embodiments, the shim waveforms may be retrieved from the memory components such as memory 30 and 72 and loaded into the shim driver 110, or other processor that may control the shim driver 110, such as CPU 28 or 40. The shim driver 110 then modulates the matrix shim coil 86 in accordance with the derived shim waveforms, thereby, mitigating and/or decreasing the effect of the $B_0$ field deviations.

Figure 6:
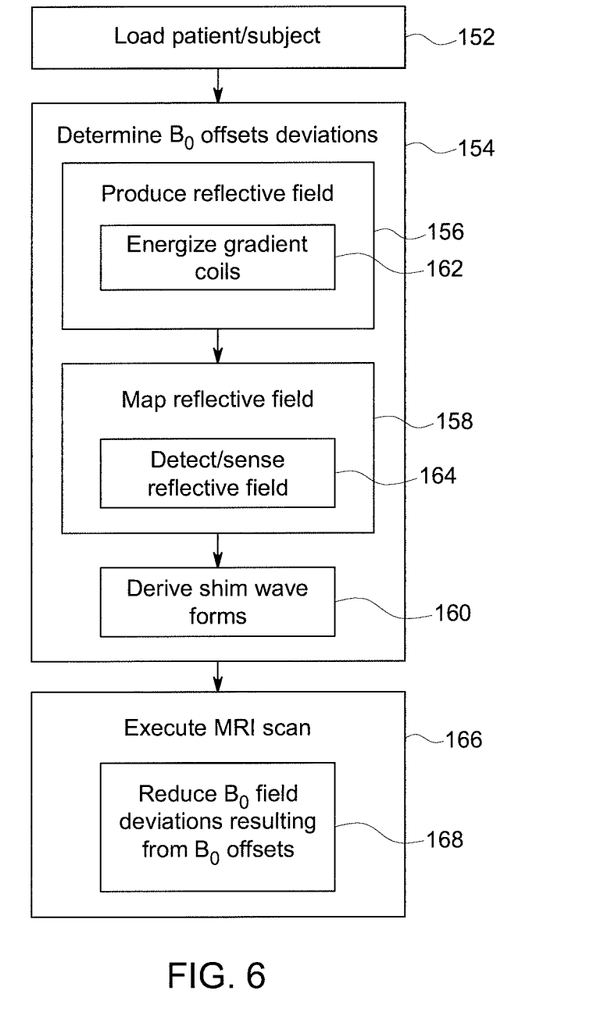
FIG. 6 is a flowchart showing a method of improving image quality by compensating for $B_0$ offsets according to yet another embodiment of the invention.

Referring to FIG. 6, a flowchart depicting a method that incorporates the MRI system of FIG. 1 to compensate for $B_0$ offsets in one or more gradient coil is depicted. At block 152, a patient or imaging subject (shown as 117 in FIG. 2) is inserted into the magnetic assembly 56 along the center axis 76 (e.g., a Z-axis) on a patient table or cradle (shown as 119 in FIG. 2). The patient table or cradle 119 is then inserted into the magnetic assembly 56 at the patient end 78.

At block 154, $B_0$ deviations resulting from $B_0$ offsets, also referred to herein as $B_0$ offset deviations, are determined. The $B_0$ field deviations resulting from $B_0$ offsets may be determined 154 by producing 156 a reflective field, mapping 158 the reflective field, and deriving 160 shim waveforms. As shown by block 162, producing 156 the reflective field may include energizing one or gradient coils 104. The gradient coils 104 may be energized in the same manner described above in regards to block 128. In embodiments, mapping 158 the reflective field may include mapping $B_0$ field inhomogenities within the reflective field in a manner in accordance with the process described herein with regard to block 124 to include detecting and/or sensing the reflective field at block 164. In embodiments, only the spatially homogeneous component of the reflective field is measured, and any spatially dependent reflective field components, such as higher order spatial harmonic terms, are ignored. Notably, the $B_0$ field deviation may vary in time.

At block 160, the determined $B_0$ field deviations are used to derive shim waveforms, which are designed to reduce and/or eliminate the $B_0$ field deviations resulting from $B_0$ offsets. As will be appreciated, the derived shim waveforms may be stored in a memory component such as memory 30 or 72. In embodiments, deriving 160 the shim waveforms may be a process apart from determining 154 the $B_0$ field offset deviations.

At block 166, a MRI scan is executed during which $B_0$ field deviations resulting from $B_0$ offsets are reduced and/or eliminated at block 168 by modulating the matrix shim coil 86 in accordance with the derived shim waveforms. In embodiments, the shim waveforms may be retrieved from the memory components such as memory 30 and 72 and loaded into the shim driver 110, or other processor that may control the shim driver 110, such as CPU 28 or 40. The shim driver 110 then modulates the matrix shim coil 86 in accordance with the derived shim waveforms, thereby, mitigating and/or decreasing the effect of the $B_0$ field deviations as shown at block 168.

It is to be understood that the shim waveforms derived from the methods described above and shown in FIGS. 4-6 may be combined. That is, embodiments of the present invention may compensate for $B_0$ field inhomogeneities resulting from/produced by reflective fields, and compensate for $B_0$ deviations resulting from gradient coils installation errors and/or $B_0$ offsets. Additionally, and as stated above, $B_0$ field inhomogeneities resulting from gradient coil installation errors and/or $B_0$ offset deviations may be deviations in the orientation of the $B_0$ field, herein also referred to as $B_0$ field orientation deviations, which result from the alignment of one or more gradient coils 104. Accordingly, the methods shown in FIGS. 5 and 6 may be considered methods for compensating gradient coil alignment.

It is also to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a method for improving image quality in a magnetic resonance imaging system includes rapidly modulating an electrical current in a matrix shim coil of the magnetic resonance imaging system to compensate high order eddy currents in the system. In certain embodiments, the matrix shim coil compensates $B_0$ field inhomogeneities having high order spatial harmonics. In certain embodiments, rapidly modulating the electrical current in the matrix shim coil is controlled by a shim driver that provides for dynamic shimming. In certain embodiments, rapidly modulating the electrical current in a matrix shim coil of the magnetic resonance imaging system includes modulating the electrical current in a first shim coil of the matrix shim coil independently from the electrical current in a second shim coil of the matrix shim coil. In certain embodiments, the magnetic current in the matrix shim coil may be modulated in accordance with a shim waveform. In certain embodiments, the method further includes deriving the shim waveform from one or more $B_0$ field inhomogeneities maps. In certain embodiments, the method further includes creating the one or more $B_0$ field inhomogeneities maps by mapping one or more reflective fields. In certain embodiments, the method further includes generating the one or more reflective fields by energizing one or more gradient coils.

Other embodiments provide for a method for compensating gradient coil alignment in a magnetic resonance imaging system. The method includes rapidly modulating an electrical current in a matrix shim coil of the magnetic resonance imaging system to mitigate one or more $B_0$ field orientation deviations resulting from the alignment of one or more gradient coils. In certain embodiments, the one or more $B_0$ field orientation deviations have high spatial harmonic orders. In certain embodiments, rapidly modulating the electrical current in the matrix shim coil is controlled by a shim driver that provides for dynamic shimming. In certain embodiments, rapidly modulating an electrical current in a matrix shim coil of the magnetic resonance imaging system to mitigate one or more $B_0$ field orientation deviations resulting from the alignment of one or more gradient coils includes modulating the electrical current in a first shim coil of the matrix shim coil independently from the electrical current in a second shim coil of the matrix shim coil. In certain embodiments, the magnetic current in the matrix shim coil is modulated in accordance with a shim waveform. In certain embodiments, the method further includes generating one or more reflective fields by energizing one or more gradient coils, creating one or more $B_0$ field inhomogeneities maps by mapping the one or more reflective fields, and deriving the shim waveform from the one or more $B_0$ field inhomogeneities maps. In certain embodiments, the alignment of the one or more gradient coils is an installation error. In certain embodiments, the alignment of the one or more gradient coils is a $B_0$ offset. Yet still other embodiments provide for a matrix shim coil apparatus for compensating high order eddy currents in a magnetic resonance imaging system. The matrix shim coil apparatus includes a matrix shim coil configured to compensates $B_0$ field inhomogeneities having high spatial harmonic orders, wherein an electrical current in a first shim coil of the matrix shim coil is rapidly modulated independently from the electrical current in a second shim coil of the matrix shim coil. In certain embodiments, the matrix shim coil apparatus further includes a shim driver configured to modulate the magnetic current in the matrix shim coil in accordance with a shim waveform. In certain embodiments, the shim driver is configured to provide for dynamic shimming. The matrix shim coil apparatus may include at least one processor configured to generate one or more reflective fields by energizing one or more gradient coils, create $B_0$ field inhomogeneities maps by mapping the one or more reflective fields, and derive the shim waveform from the one or more created $B_0$ field inhomogeneities maps.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are are not intended to be interpreted based on 35 U.S.C. § 112(f), unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A method for improving image quality in a magnetic resonance imaging system comprising:
   rapidly modulating an electrical current in a matrix shim coil of the magnetic resonance imaging system, wherein the matrix shim coil includes a plurality of individual shim coils disposed on a cylindrical surface around an inner gradient coil assembly, the electrical current in a first shim coil of the matrix shim coil is modulated independently from electrical current in a second shim coil of the matrix shim coil, the rapid modulation compensating high order eddy currents in the system.

2. The method of claim 1, wherein the matrix shim coil compensates $B_0$ field inhomogeneities having high order spatial harmonics.

3. The method of claim 1, wherein rapidly modulating the electrical current in the matrix shim coil is controlled by a shim driver that provides for dynamic shimming.

4. The method of claim 1, wherein the magnetic current in the matrix shim coil is modulated in accordance with a shim waveform.

5. The method of claim 4, the method further comprising:
   deriving the shim waveform from one or more $B_0$ field inhomogeneities maps.

6. The method of claim 5, the method further comprising:
   creating the one or more $B_0$ field inhomogeneities maps by mapping one or more reflective fields.

7. The method of claim 6, the method further comprising:
   generating the one or more reflective fields by energizing one or more gradient coils.

8. A method for compensating gradient coil alignment in a magnetic resonance imaging system, the method comprising:
   rapidly modulating an electrical current in a matrix shim coil of the magnetic resonance imaging system to mitigate one or more $B_0$ field orientation deviations resulting from the alignment of one or more gradient coils, wherein the matrix shim coil includes a plurality of individual shim coils disposed on a cylindrical surface around an inner gradient coil assembly, and the electrical current in a first shim coil of the matrix shim coil is modulated independently from electrical current in a second shim coil of the matrix shim coil.

9. The method of claim 8, wherein the one or more $B_0$ field orientation deviations have high spatial harmonic orders.

10. The method of claim 8, wherein rapidly modulating the electrical current in the matrix shim coil is controlled by a shim driver that provides for dynamic shimming.

11. The method of claim 8, wherein the magnetic current in the matrix shim coil is modulated in accordance with a shim waveform.

12. The method of claim 11, the method further comprising:
    generating one or more reflective fields by energizing one or more gradient coils;
    creating one or more $B_0$ field inhomogeneities maps by mapping the one or more reflective fields; and
    deriving the shim waveform from the one or more $B_0$ field inhomogeneities maps.

13. The method of claim 8, wherein the alignment of the one or more gradient coils is an installation error.

14. The method of claim 8, wherein the alignment of the one or more gradient coils is a $B_0$ offset.

15. A matrix shim coil apparatus for compensating high order eddy currents in a magnetic resonance imaging system, the matrix shim coil apparatus comprising:
    a matrix shim coil configured to compensate $B_0$ field inhomogeneities having high spatial harmonic orders, the matrix shim coil including a plurality of individual shim coils disposed on a cylindrical surface around an inner gradient coil assembly, electrical current in a first shim coil of the matrix shim coil is modulated independently from a second shim coil of the matrix shim coil.

16. The matrix shim coil apparatus of claim 15, wherein the matrix shim coil apparatus further comprises:
    a shim driver configured to modulate the magnetic current in the matrix shim coil in accordance with a shim waveform.

17. The matrix shim coil apparatus of claim 16, wherein the shim driver is configured to provide for dynamic shimming.

18. The matrix shim coil apparatus of claim 16, wherein the matrix shim coil apparatus further comprises:
   at least one processor configured to:
      generate one or more reflective fields by energizing one or more gradient coils;
      create $B_0$ field inhomogeneities maps by mapping the one or more reflective fields; and
      derive the shim waveform from the one or more created $B_0$ field inhomogeneities maps.

* * * * *